United States Patent [19]

Jeffers

[11] 4,413,296

[45] Nov. 1, 1983

[54] THIN FILM MAGNETORESISTIVE HEAD

[75] Inventor: Frederick J. Jeffers, Escondido, Calif.

[73] Assignee: Eastman Kodak Company, Rochester, N.Y.

[21] Appl. No.: 269,186

[22] Filed: Jun. 1, 1981

Related U.S. Application Data

[60] Division of Ser. No. 57,619, Jul. 16, 1979, Pat. No. 4,306,215, which is a continuation-in-part of Ser. No. 23,433, Mar. 23, 1979, abandoned.

[51] Int. Cl.³ .............................................. G11B 5/30
[52] U.S. Cl. .................................. 360/113; 338/32 R
[58] Field of Search ............. 360/113, 126; 338/32 R; 324/252

[56] References Cited

U.S. PATENT DOCUMENTS 3,945,038  3/1976  Lazzari ................................. 360/113
4,047,236  9/1977  Lee ...................................... 360/113
4,053,829 10/1977  Maruo ............................... 338/32 R

OTHER PUBLICATIONS

O'Day, "Balanced Magnetic Head", IBM Tech. Disc. Bul., vol. 15, No. 9, Feb. 1973, p. 2680.

Primary Examiner—Alan Faber
Attorney, Agent, or Firm—Robert F. Cody

[57] ABSTRACT

Flux sensitive apparatus, in one form thereof, employs paired thin single domain magnetic film structures, the easy magnetization axes of which are canted with respect to the direction of sense current flow therewithin. The magnetization vectors of the film structures are opposite with respect to each other, thereby to preclude, or at least lessen, demagnetization fields associated with the structures. By special connections between the thin film structures, the respective sense currents therein are provided with the same spatial direction of flow; and mutual biasing of the structures is thereby avoided.

3 Claims, 11 Drawing Figures

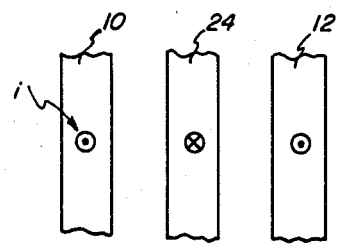
$$H(10) = H_{24}\uparrow + H_{12}\downarrow \simeq 0$$
$$H(24) = H_{10}\uparrow + H_{12}\downarrow \simeq 0$$
$$H(12) = H_{10}\uparrow + H_{24}\downarrow \simeq 0$$
FIG. 4
FIG. 5a
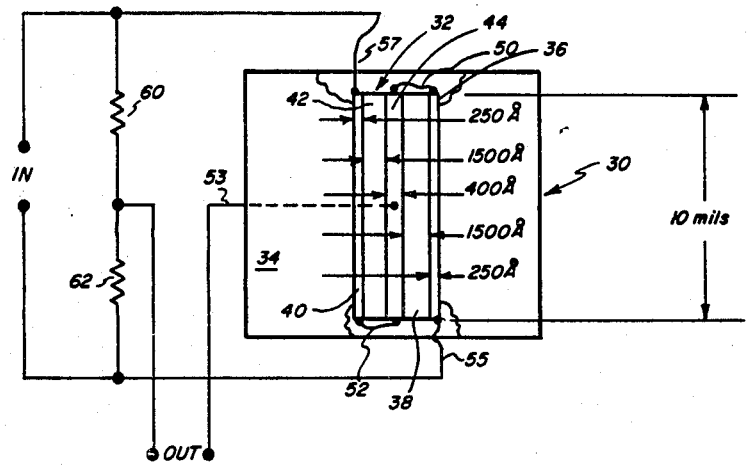
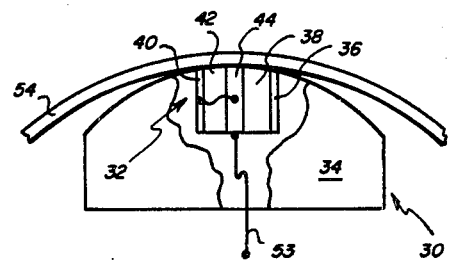
FIG. 5b

THIN FILM MAGNETORESISTIVE HEAD

This is a division of application Ser. No. 057,619, filed July 16, 1979 now U.S. Pat. No. 4,306,215, which application Ser. No. 057,619 is a continuation-in-part of application Ser. No. 023,433, filed Mar. 23, 1979, now abandoned.

BACKGROUND OF THE INVENTION

1. Field of the Invention

This invention relates in general to magnetic flux sensing apparatus and, in particular, to a magnetic head of the type employing a thin single domain magnetic film structure as a magnetoresistive element responsive to the flux being sensed.

2. Background Relative to the Prior Art

Playback of recorded signals from a magnetic recording medium by means of a conventional magnetic head that is sensitive to flux rate-of-change is difficult for low recorded signal frequencies, and theoretically impossible for recorded DC signals, or when there is no relative speed between the recording medium and the magnetic head. Accordingly, various techniques have been proposed for sensing magnetic flux, as opposed to the rate-of-change of such flux, e.g. Hall effect, flux gate, and magnetoresistive devices, thereby to permit recording media to be used as optimally as possible.

With regard to the matter of magnetoresistive devices for sensing magnetic fields, the use of a thin single domain magnetic film for field sensing purposes is known. Representative prior art depicting the use of magnetoresistive thin film structures can be found in the following references: U.S. Pat. No. 3,731,007; U.S. Pat. No. 3,947,889; U.S. Pat. No. 3,921,218; U.S. Pat. No. 3,945,038; and U.S. Pat. No. 4,051,542. Typically, a thin (planar) single domain magnetoresistive film is employed to sense a magnetic field to which it is exposed by passing an electrical/sense current (either AC or DC) through the film, the film magnetization vector being canted with respect to the direction of current flow. The field being sensed exerts a torque on the magnetic moment in the film, causing the resistance of the film to increase or decrease depending on the sense and magnitude of the field applied to the film. The resistance of the film is, therefore, the analog of the field strength. Although such use of a magnetoresistive film represents a reasonably workable technique in the art of magnetic flux sensing, it suffers from, among other things, the standpoint of reduced sensitivity to the external field: this is because pole formation at the edges of the film in question causes the generation of a large demagnetization field which adversely affects the effectiveness of the film.

SUMMARY OF THE INVENTION

Having identified the "demagnetization field" as an important cause of insensitivity in a thin film magnetoresistive sensor, the present invention provides for the nullification of such demagnetization by use of two canted easy axis thin film structures, which are essentially electrically insulated from, but proximate, each other. The planes of the two films are substantially parallel, and the cants associated with their respective magnetization vectors are at angles of about 180° with respect to each other. This provides for flux closure between the films and precludes demagnetization.

Although sense current need only traverse one of the films (the second film merely acting as a keeper), both films may be utilized for flux sensing, provided they are utilized as respective legs of a bridge circuit. This is necessary because any field which is sensed will oppositely affect the resistance of the two films, i.e. the combined resistances of the two films will remain constant in the presence of an applied field. With sense current traversing both films, however, a new problem occurs if current traverses one film in one spatial direction and serially traverses the other film in the opposite spatial direction. The newly identified problem is that the respective currents in the films will cooperate to create a field which magnetically biases the films, thereby giving rise both to some insensitivity and to distortion. In the interest of avoiding the biasing of the films by the respective sense currents, the invention further teaches the use of sense currents which traverse their respective films in the same spatial direction, thereby to effect field cancellation between the films. Mere "same direction current", however, is alone not enough to preclude unwanted biasing of the films. For example, if the currents through the two films are in the same spatial direction but the films are connected electrically in parallel, the field cancellation between the films will be incomplete in the presence of an ambient field. That is, since one magnetoresistor has increased resistance, and one has decreased resistance, in response to an applied field, the currents in the films will differ, and the current-induced bias fields will similarly be different, albeit that such bias fields will be bucking. To effect virtually complete cancellation of current-induced biasing, the invention further teaches such serial electrical connection of the magnetic films that the sense current—which inherently must be the same in the serially connected films—traverses the two films in the same spatial direction. Examples of this technique will be provided below.

The invention will be described with reference to the Figures wherein:

FIG. 4 is a diagrammatic showing useful in describing bias field cancellation in the presently preferred form of the invention;

FIGS. 5a and 5b are respectively partially schematic plan and side elevational showings of a magnetic head structure embodying the invention;

Figure 1A:
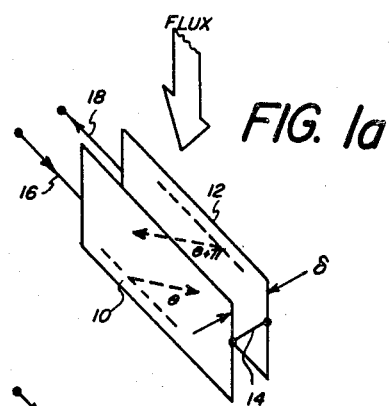
FIGS. 1a and 1b are respectively a perspective showing of a basic embodiment of the invention, and a schematic showing of a utilization circuit therefor.

Referring to FIG. 1a, a pair of planar thin single domain magnetic film structures 10,12 are disposed in close parallel relationship to each other, thereby to preclude demagnetization of the films by providing flux closure between the films. The thin film structures 10,12 are electrically connected in series by means of a lead 14 and, in this embodiment of the invention, current is passed through the thin film structures by means of leads 16,18. Except for the lead 14, the thin film structures 10,12 are electrically insulated from each other; and each thin film structure has its easy axis canted with respect to the direction of current flow. The magnetization vector of the thin film structure 10 is at an angle $\theta$ with respect to the direction of current flow; and the magnetization vector of the film structure 12 is at 180° with respect to the angle $\theta$. Although the assemblage of FIG. 1a is magnetoresistively responsive to magnetic flux applied to any edge thereof, consider the measurement of a magnetic field as represented by the arrow labeled FLUX: The applied field torques the film 10 magnetization vector to lessen its angle $\theta$ in proportion to the field strength, while similarly working to increase the angle $\theta + \pi$ of the film 12 magnetization vector. Attendantly, the resistance of the thin film structure 10 increases; and the resistance of the thin film structure 12 decreases. Although the combined serial resistance of the structures 10,12 is (substantially) unchanged in the presence of the field being sensed, field strength can be determined by use of the FIG. 1a structure in connection with a bridge circuit. See FIG. 1b in which fixed resistors 20,22 have the same resistance values as the nominal magnetoresistances of the thin film structure 10,12.

Figure 1B:
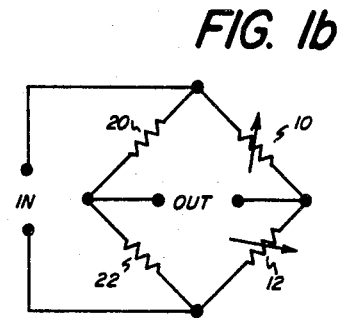

In the presence of the applied field, the magnetoresistances of the structures 10,12 respectively, decrease and increase (or vice versa if the field direction is opposite), whereby a voltage applied across the bridge circuit of FIG. 1b redistributes itself to cause a voltage to appear across the OUT contacts of the bridge in proportion to the strength of the applied field.

Of concern in the case of a magnetoresistor arrangement as in FIG. 1a is the fact that, while demagnetization fields are precluded (or lessened) thereby, the sense current which is employed creates a field between the thin film structures 10,12 which undesirably biases the thin film structures 10,12. That is, the current-induced field produced about the structure 10 additively cooperates, between the thin film structures 10,12, with the current-induced field produced about the structure 12.

Figure 2A:
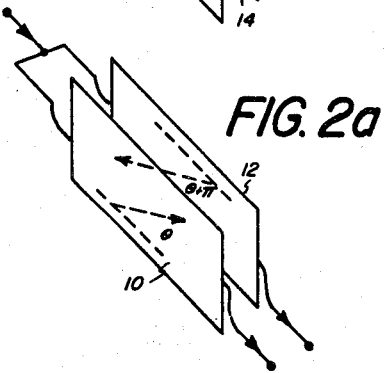
FIGS. 2a and 2b are respectively a perspective showing of another embodiment of the invention, and a schematic showing of a utilization circuit therefor.

In an attempt to obviate such biasing of the thin film structures 10,12, the arrangement of FIG. 1a may be modified as in FIG. 2a, whereby separate sense currents flow electrically in parallel in each of the thin film structures. While such a technique works to lessen the bias imbalance produced in the FIG. 1a structure, the bias dependence on sense current, however, remains.

Figure 2B:
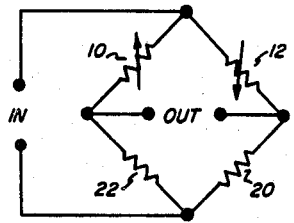

By rearranging the bridge circuit of FIG. 1b to that depicted in FIG. 2b, the electrically parallel thin film structures of FIG. 2a may be employed to provide a signal which is the analog of the applied field. That is, a voltage applied across the bridge circuit of FIG. 2b redistributes itself in response to changed magnetoresistances, thereby to produce a field-representative output voltage.

To provide identical, same spatial direction, currents in each of the thin film structures 10,12, the invention in its presently preferred form employs such serial connection between the thin film structures 10,12 that the output end of one thin film structure (10) is connected to the input end of the other thin film structure (12). See FIG. 3a for one example of the preferred form of the invention. To be noted is that sense current enters one end 10' of the thin film structure 10, and traverses the thin film structure 10 to its output end 10". The sense current is then carried by means of an electrically conductive, nonmagnetic film 24 to the input end 12' of the thin film structure 12. After the sense current traverses the thin film structure 12, it exits at the output end 12" of the thin film structure 12. Although the long-edge view of the assemblage of FIG. 3b is in the general form of an N, it will be appreciated that, in use, the three leaves of the N collapse into a laminar structure, there being electrical insulation between the leaves except at the ends 10" and 12".

Figure 3A:
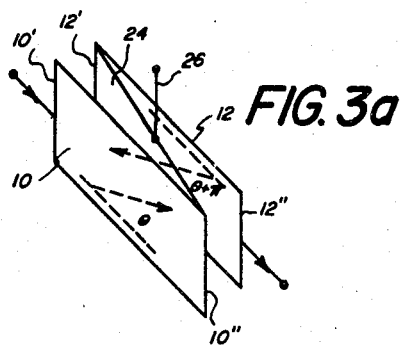
FIGS. 3a and 3b are respectively a perspective showing of a presently preferred embodiment of the invention, and a schematic showing of a utilization circuit therefor.
Figure 3B:
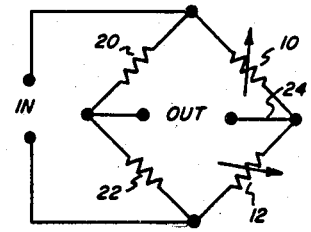

Utilizing an electrical contact 26 to the conductive film 24, the assemblage of FIG. 3a may be connected into a bridge circuit as shown in FIG. 3b. Except for the matter of bias field cancellation, the circuit of FIG. 3b works exactly the same as the circuit of FIG. 1b. Concerning the matter of bias field cancellation, however, reference should be had to FIG. 4. As will be appreciated from the accompanying equations, the current induced fields produced by any pair of conductors will substantially exactly cancel (current induced fields are inherently equal) at any remaining third conductor, thereby precluding the existence of distortion-producing and insensitivity-producing bias fields due to sense currents.

Reference should now be had to FIGS. 5a and 5b which show a magnetic head structure 30 based on the preferred form of the invention: The head structure of FIGS. 5a and 5b (which obviously are not to scale) is comprised of a flux sensitive assemblage 32 supported in ceramic 34. The flux sensitive assemblage 32 is made up of a series of elongated laminae: a 250 Å thick coat 36 of permalloy with its easy axis canted at an angle $\theta$ with respect to the length thereof; a 1500 Å thick nonmagnetic electrically nonconductive support 38 for the permalloy coat 36; a 250 Å thick coat 40 of permalloy with an easy axis canted at the same angle $\theta$ with respect to the length thereof; a 1500 Å thick nonmagnetic electrically nonconductive support 42 for the permalloy coat 40; and a 400 Å thick nonmagnetic electrically conductive coat 44 (e.g. gold) sandwiched between the laminae 38 and 40. The laminae 36 and 44 are electrically connected in series by a lead 50; and the laminae 40 and 44 are electrically connected in series by a lead 52. Also, a lead 53 (corresponding to the lead 26 of FIG. 3a), and leads 55 and 57 are connected respectively to the conductive lamina 44 and to the permalloy laminae 36 and 40, all such leads being carried to the exterior of the head structure 30.

The magnetic moments of the two magnetic films are caused to point in opposite directions along their respective parallel easy axes. Thus the demagnetization fields are externally coupled and have no effect on the system.

As a magnetic medium (preferably of low electrical conductivity) such as magnetic tape 54 rides over the head structure 30, flux patterns in the tape 50 exert magnetic torques on the magnetization vectors of the permalloy laminae 35,40 thereby causing the magnetoresistances of the laminae 36,40 to increase and decrease respectively... and vice versa. With the head structure 30 connected into a bridge circuit comprised of resistors 60,62, a 1a the circuit of FIG. 3b, the strength of any magnetic field recorded in the medium will be determined as discussed above in connection with FIG. 3b.

It will be appreciated that, by virtue of the pairing of the magnetoresistive laminae 36,40, unwanted demagnetization fields are largely precluded. And, by use of three electrical conductors (laminae 36,40,44) the currents in the magnetoresistive laminae 36,40 may be serially arranged for same-spatial-direction flow, thereby precluding the unwanted mutual biasing of the laminae 36,40.

Figure 6:
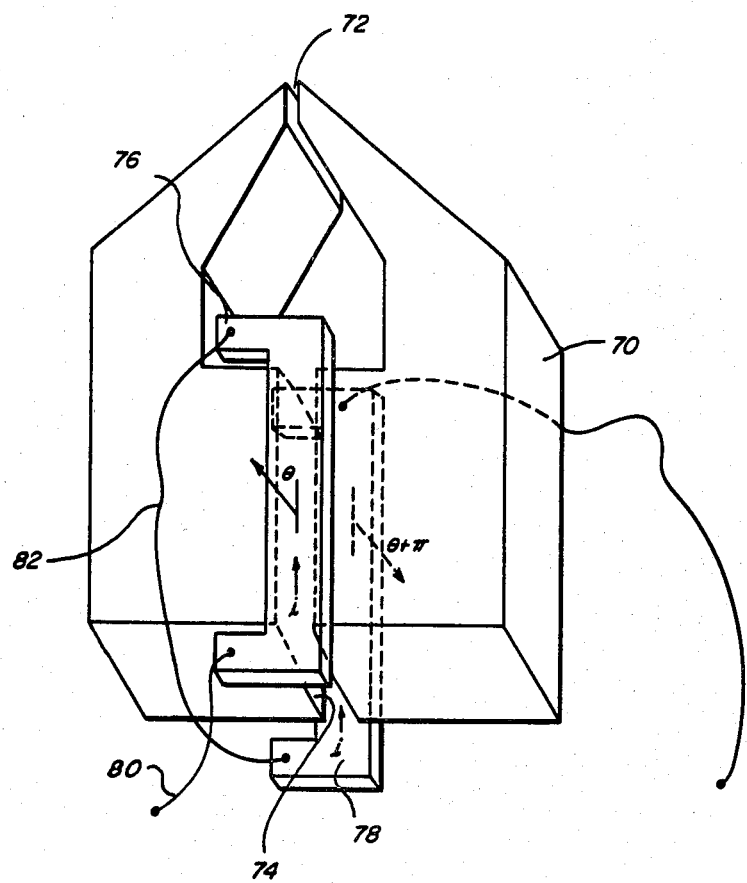
FIG. 6 is a perspective view of an alternative embodiment of the invention.

Reference should now be had to FIG. 6 which shows a variation of the presently preferred head structure: A somewhat conventional low reluctance magnetic core 70 having front and back gaps 72,74 has a pair of magnetoresistive strips 76,78 bridging the back gap 74 as shown. The magnetoresistive strips 76,78 have their respective easy axes canted at an angle $\theta$ with respect to the strip lengths. And, current entering the strip 76 via a lead 80 is so serially carried, by a lead 82, from the output of the strip 76 to the input of the strip 78 that the current flows in each strip in the same spatial direction. The moments of the two layers are oppositely directed along their parallel easy axes. Since the lead 82 is relatively remote with respect to the strips 76,78, its surrounding field has little effect on biasing the strips; and the fields about the strips 76,78 arising from magnetic poles at the edges, mutually cancel each other, thereby precluding unwanted fields at the front gap of the head structure 72. Further, because of the relatively low reluctance of the core 70 material, demagnetization fields are shunted through the core from one strip to the other (for flux closure), thereby to provide the sensitivity and distortionless playback which is characteristic of the invention.

The head of FIG. 6 is adapted to be electrically connected into a bridge circuit as in FIG. 3b. When signal flux enters the front gap 72 of the head, the magnetization vectors of the strips 76,78 experience torques, and cause a corresponding signal to be produced.

Figure 7:
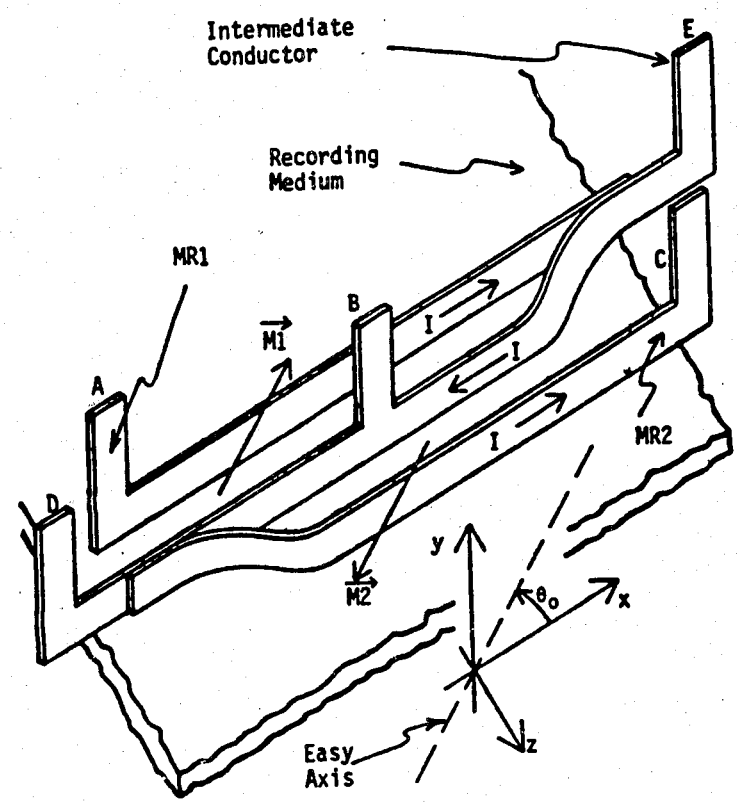
FIG. 7 is a schematic drawing of apparatus embodying the invention.

The invention has been described in detail with particular reference to certain preferred embodiments thereof, but it will be understood that variations and modifications can be effected within the spirit and scope of the invention. For example, although in the presently preferred form of the invention, only one pair of magnetoresistive elements is shown and described in cooperation with one nonmagnetic electrically conductive element, it is, of course, within the scope of the invention to employ any even number of magnetoresistive elements in similar cooperation with an odd number of nonmagnetic electrically conductive elements, e.g. four magnetoresistive laminae interleaved with three nonmagnetic electrically conductive laminae. Also, reference should be had to FIG. 7 which shows the presently preferred form of the structure disclosed in FIG. 3a.

What is claimed is:

1. A magnetic head comprising:
    (a) first and second pole pieces disposed with respect to each other so as to form front and back nonmagnetic gaps therebetween, said front gap being a transducer gap disposed to coact with a magnetic recording medium,
    (b) first and second electrically conductive thin single domain magnetic film means secured to opposing sides of said pole pieces at said back gap, said thin magnetic film means being so disposed with respect to said pole pieces and said back gap that flux bridges said back gap via said thin magnetic film means,
    (c) said first thin magnetic film means having first and second electrical contacts respectively for receiving and exiting electrical current therein, the easy axis of said first thin magnetic film means being canted relative to the current flow path between said first and second contacts, and
    (d) said second thin magnetic film means having first and second electrical contacts respectively for receiving and exiting electrical current therein, the easy axis of said second thin magnetic film means being (1) canted relative to the current flow path between the first and second contacts of said second thin magnetic film means, and (2), substantially parallel to the easy axis direction of said first thin magnetic film means,
    the current path in said second thin magnetic film means being parallel to the current path in said first thin magnetic film means, whereby flux entering the front gap of said head causes the magnetoresistances of said thin magnetic film means to vary inversely.

2. The structure of claim 1 including means for electrically connecting the second contact of said first thin magnetic film means to the first contact of said second thin magnetic film means.

3. A magnetic head comprising:
    (a) first and second pole pieces disposed with respect to each other so as to form front and back nonmagnetic gaps therebetween, said front gap being a transducer gap disposed to coact with a magnetic recording medium,
    (b) first and second electrically conductive thin single domain magnetic film means secured to opposing sides of said pole pieces at said back gap, said thin magnetic film means being so disposed with respect to said pole pieces and said back gap that flux bridges said back gap via said thin magnetic film means,
    (c) said first thin magnetic film means having first and second electrical contacts respectively for receiving and exiting electrical current therein, the magnetization of said first thin magnetic film means being canted relative to the current flow path between said first and second contacts, and
    (d) said second thin magnetic film means having first and second electrical contacts respectively receiving and exiting electrical current therein, the magnetization of said second thin magnetic film means being (1) canted relative to the current flow path between its first and second contacts, and (2) substantially parallel to the direction of said magnetization of said first thin magnetic film means,
    the current path in said second thin magnetic film means being parallel to the current path in said first thin magnetic film means, whereby flux entering the front gap of said head causes the magnetoresistances of said thin magnetic film means to vary inversely.

* * * * *